United States Patent
Rakus et al.

(10) Patent No.: US 11,442,109 B2
(45) Date of Patent: Sep. 13, 2022

(54) SYSTEM AND METHOD FOR ASSESSING CIRCUIT INTERRUPTER OPERATING MECHANISM RELIABILITY, AND CIRCUIT INTERRUPTER

(71) Applicant: Eaton Intelligent Power Limited, Dublin (IE)

(72) Inventors: Paul R. Rakus, Moon Township, PA (US); Michael Slepian, Murrysville, PA (US); Saudamini Joshi, Pune (IN); Ravikumar S., Hyderabad (IN); Sachin Bhimrao Ahirrao, Pune (IN); Kunal Teli, Mumbai (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 94 days.

(21) Appl. No.: 17/010,511

(22) Filed: Sep. 2, 2020

(65) Prior Publication Data

US 2021/0072315 A1    Mar. 11, 2021

Related U.S. Application Data

(60) Provisional application No. 62/896,071, filed on Sep. 5, 2019.

(51) Int. Cl.
*G01R 31/333* (2006.01)
*H01H 11/00* (2006.01)

(52) U.S. Cl.
CPC ....... *G01R 31/333* (2013.01); *H01H 11/0062* (2013.01)

(58) Field of Classification Search
CPC ............................. G01R 31/333; H01H 11/0062
See application file for complete search history.

(56) References Cited

U.S. PATENT DOCUMENTS

| | | | |
|---|---|---|---|
| 4,400,981 A | 8/1983 | Aoyagi et al. | |
| 4,552,718 A * | 11/1985 | Impink, Jr. | G05B 9/02 376/245 |

(Continued)

FOREIGN PATENT DOCUMENTS

WO    WO-2015162541 A1 * 10/2015    ......... G05B 23/0218

OTHER PUBLICATIONS

European Patent Office "extended European search report", for corresponding European patent application No. 20194477.4, dated Feb. 3, 2021, 8 pp.

*Primary Examiner* — Scott Bauer
(74) *Attorney, Agent, or Firm* — Eckert Seamans Cherin & Mellott, LLC

(57) ABSTRACT

A method of determining if a circuit interrupter operating mechanism has an acceptable trip margin includes determining a model trip margin, providing a circuit interrupter, the circuit interrupter disposed in situ, the circuit interrupter including an operating mechanism, determining a circuit interrupter trip margin by: providing an internal sensor assembly, the internal trip margin sensor assembly structured to record trip margin data, providing a transfer function module, providing a computer structured to execute the transfer function module, executing the transfer function module on the computer, utilizing the trip margin sensor assembly to generate trip margin data, transmitting the trip margin data to the transfer function module, processing the trip margin data to generate a trip margin, and determining if the trip margin is acceptable relative to the model trip margin.

17 Claims, 9 Drawing Sheets

(56) References Cited

U.S. PATENT DOCUMENTS

| | | | |
|---|---|---|---|
| 2010/0262309 A1* | 10/2010 | Currie | ............... H02J 3/005 |
| | | | 700/291 |
| 2011/0062006 A1 | 3/2011 | Gottschalk et al. | |
| 2017/0047186 A1 | 2/2017 | Chen et al. | |

* cited by examiner

SYSTEM AND METHOD FOR ASSESSING CIRCUIT INTERRUPTER OPERATING MECHANISM RELIABILITY, AND CIRCUIT INTERRUPTER

CROSS REFERENCE TO RELATED APPLICATION

This application claims priority to U.S. Provisional Patent Application Ser. No. 62/896,071, filed Sep. 5, 2019, the disclosures of which are incorporated herein by reference.

BACKGROUND

Field

The disclosed and claimed concept relates to circuit interrupters and, more specifically, to a system and method for assessing circuit interrupter operating mechanism reliability, and to a circuit interrupter.

Related Art

Electrical switching apparatus include, for example, circuit switching devices, circuit interrupters, such as circuit breakers, network protectors, contactors, motor starters, motor controllers, and other load controllers. Electrical switching apparatus such as circuit interrupters and, in particular, circuit breakers, are well known in the art. Circuit breakers are used to protect electrical circuitry from damage due to an over-current condition, such as an overload condition or a relatively high level short circuit or fault condition, and other conditions. Circuit breakers, typically, include a number of pairs of separable contacts, an operating mechanism, and a trip unit. As employed herein, the expression "a number of" and variations thereof shall refer broadly to any non-zero quantity, including a quantity of one. The separable contacts, typically, include a stationary contact and a movable contact. The movable contact is structured to move between an open, first position and a closed, second position. Stated alternately, the separable contacts move between an open, first configuration and a closed, second configuration.

The separable contacts may be operated either manually by way of a handle disposed on the outside of the case or automatically in response to an over-current condition or other condition. That is, a circuit breaker includes an operating mechanism and a trip unit. The operating mechanism is designed to rapidly open and close the separable contacts. That is, the operating mechanism is operatively coupled to the movable contact and moves between a first configuration and a second configuration corresponding to the position of the movable contact. That is, for example, when the movable contact is in its first position, the operating mechanism is in its first configuration. The operating mechanism is structured to be latched and thereby maintain the contacts in the closed configuration. The trip unit is structured to detect over-current conditions and other predefined conditions. When an over-current or other predefined condition is detected, the trip unit releases the operating mechanism latch thereby allowing biasing elements to move the operating mechanism and contacts to the open, first configuration.

A circuit interrupter operating mechanism typically includes a number of components. such as, but not limited to, springs, linkages, a catch, and a latch. The springs provide bias/force that moves the other components. The catch and latch hold the components in a selected configuration, the linkages operatively couple the operating mechanism components to the separable contacts. As a general example, the catch is a D-shaft rotatably coupled to a housing and is structured to move between a first position and a second position. The position of the D-shaft corresponds to the operating mechanism configuration. That is, for example, when the operating mechanism is in the second configuration, the D-shaft is in its second position. The latch is a linkage member identified as a "moving trip latch." The moving trip latch moves and, in an exemplary embodiment, rotates between a first position and a second position corresponding to the operating mechanism configuration.

When the separable contacts are in the closed, second configuration, the springs apply a bias to the linkage that would, but for the catch/latch, move the separable contacts to the open, first configuration. When actuated by the handle or the trip unit, the D-shaft rotates thereby releasing, i.e., unlatching, the moving trip latch and allowing the springs to bias the linkage to move the separable contacts to the open, first configuration.

As circuit interrupters protect equipment and lives, the reliability of the circuit interrupter operating mechanism is a concern. That is, a failure of the circuit interrupter operating mechanism will result in a failure of the separable contacts to acceptably open or close. In the past, the reliability of the circuit interrupter operating mechanism has been determined by measuring a "latch load." The latch load is the load to rotate the D-shaft (through another linkage), and is indicative of the load at the interface of the latch and the catch, but also includes other factors, thereby diluting the "signal". Generally, a high latch load would tend to indicate that the operating mechanism is "healthy," i.e., the operating mechanism will operate as intended. It is noted, however, that this measurement is taken when the operating mechanism is static, i.e., not moving between configurations. It also has been determined that some operating mechanisms with a high latch load nevertheless fail to operate. As described in greater detail elsewhere herein, friction between elements of the operating mechanism can cause the operating mechanism to bind and fail to move the movable contacts. Such friction is, generally, not detectable when statically measuring the latch load. That is, after an operating mechanism is moved into the closed configuration, vibrations can tend to overcome friction in the operating mechanism. That is, vibrations can move the elements of the operating mechanism thereby moving slightly beyond a configuration wherein the friction resists the motion of the operating mechanism elements, while still maintaining the operating mechanism in the second configuration. More specifically, the vibrations of the closing event "mask" the effects of friction because they "excite" all the parts in the system, overcoming friction and allowing the components of the mechanism to move more freely than they might otherwise move during a tripping event. The vibration allows the hatchet to apply a full healthy load against the d-shaft despite sources of excessive ("unhealthy") friction that might be present. In that case the latch release load would be relatively high and appear healthy, despite high friction that will impede motion of the latch when it is released. This results in the detection of a high, or supposedly "healthy," latch load between the latch and the D-shaft. This latch load, however, does not accurately reflect the health of the operating mechanism because once the elements of the operating mechanism begin to move to the first configuration, the friction in the operating mechanism and elsewhere resists the forces acting on the operating mechanism linkages. Thus, despite latch load evidence indicating that the operating mechanism is supposedly "healthy," some operating mechanisms fail to operate as intended. Stated alternately, the latch load test is not as accurate as is desired, which is undesirable.

As such, a different measurement/test has been developed to determine if an operating mechanism is "healthy." The different measurement is identified as the "trip margin." As used herein, the "trip margin" means a measurement of force throughout or along a certain range of motion wherein the force is a restraining force acting on an operating mechanism linkage member, e.g., the moving trip latch, during the initial motion of the tripping action. Such a restraining force can also be interpreted as the surplus static force through a range of positions, i.e., the force motivating the release motion. The "trip margin" thus is a measurement taken when the operating mechanism is moving between configurations and which may be represented graphically as a plot of force over time or, potentially, as a plot of force over distance. While it is true that the moving trip latch is in motion in such a situation, it is restrained to move slowly, so it's really a "quasi-static" state.

An exemplary trip margin plot is shown in FIG. 1 and multiple exemplary trip margins (each for a different type of circuit interrupter) are shown in FIG. 2. It is noted that the "plunger" identified in FIG. 1 is part of the linkage between a servo-motor and a probe of a test apparatus that is described in greater detail elsewhere herein. It is further noted that the word "type" is used to indicate a plurality of circuit interrupters with identical, or substantially similar, characteristics. A "type" of circuit interrupter is also identified as a circuit interrupter "model." The term "model," however, is used in a different context below, so the term "type" is used herein to identify circuit interrupters with identical, or substantially similar, characteristics.

Hereinafter, the expression "trip margin" will discussed with respect to the moving trip latch and as the operating mechanism moves from the second configuration toward the first configuration, i.e., as the separable contacts open. It is understood, however, that a "trip margin" could be determined at another linkage member (not necessarily the moving trip latch) and/or as the operating mechanism moves from the first configuration to the second configuration, i.e., as the separable contacts close, by way of example. Further, in an exemplary embodiment, the trip margin is determined as the moving trip latch rotates over about three degrees to about five degrees beginning in the latch position (but with the D-shaft rotated to release the trip latch) and moving in the direction of opening the contacts. In the exemplary embodiment discussed below, therefore, the trip margin is determined only over the initial movement of the moving trip latch from the second configuration toward the first configuration. As the mechanism progresses past the initial movement, the mechanical advantage for continued motion becomes very large and friction becomes trivial.

More specifically, a test apparatus has been developed to measure the trip margin. The trip margin test occurs on a test bed, i.e., the circuit interrupter is placed in a test facility having a test apparatus. The test apparatus includes the aforementioned servo-motor, the aforementioned probe, and a number of sensors. The servo-motor is operatively coupled to the probe and is structured to limit/control the motion of the probe. The sensor(s) are structured to measure the force acting on the probe. In operation, the probe is disposed against the moving trip latch when the moving trip latch is in the second configuration, i.e., when the moving trip latch is latched, and is disposed in the moving trip latch's path of motion. The D-shaft is then rotated thereby releasing the moving trip latch. This results in the moving trip latch being biased against the probe as the moving trip latch moves. As used herein, the interface of the probe and the moving trip latch is a "prime" measurement location. That is, the "prime" measurement location is a location wherein measuring the force at that location is measuring the force for which the trip margin has been (or is being) determined.

The servo-motor limits/controls the motion of the probe while maintaining the probe in the moving trip latch's path of motion. Thus, the bias/force acting on the moving trip latch is transmitted to the probe. The servo-motor controls the speed of the probe, and therefore the moving trip latch. In an exemplary embodiment, the probe allows the moving trip latch to move for about one second. As the moving trip latch and probe move, the force at the moving trip latch/probe interface is measured and recorded. After the probe has moved about 0.1 inch, the test is completed and the servo-motor is reversed thereby causing the probe to move the moving trip latch back to its second position. The D-shaft is then returned to the second position thereby latching the moving trip latch and maintaining the operating mechanism in the second configuration.

It is understood that the force detected by the probe is generated by the operating mechanism springs and transmitted via the operating mechanism linkage(s). It is further understood that friction between elements of the operating mechanism linkage(s) counteracts the bias of these springs and thus reduces the biasing force that is applied to the moving trip latch. That is, as an extreme (and hypothetical) example, if the linkage members were rusted, the friction would be greatly increased. If the friction is sufficiently high, the force generated by the operating mechanism springs cannot overcome the friction and the operating mechanism fails to move between configurations. Thus, it is understood that as friction increases, the trip margin is reduced. That is, and for example, if the moving trip latch is stationary, the force on the probe would be zero. Thus, generally, the lower the trip margin, the less healthy the operating mechanism. Stated alternately, friction in the operating mechanism indicates that the operating mechanism is closer to failure; thus, increased friction (i.e., a low trip margin) indicates that the operating mechanism is close to failure. Generally, if the trip margin is ever below about 2.0 lbf, the operating mechanism is deemed unsatisfactory.

When the trip margin is plotted over time, i.e., force vs. time, the plot line is generally shaped as a checkmark. That is, there is a starting force that is reduced during the initial motion of the moving trip latch, such as in FIG. 1. Continued motion of the operating mechanism components then causes the force to increase above the initial force. Stated alternately, following an initial drop in the trip margin, an increasing mechanical advantage in the kinematics of the operating mechanism configuration cause the trip margin to increase.

Thus, in summary, the traditional historic method of measuring tripping reliability was measuring the "latch load," or force to release the latch. It has been found that traditional trip latch load measurement (force or torque required to release the trip latch, or rotate the D-shaft) can be an indicator of tripping reliability, but it has been determined to be inadequate and is often misleading. As a circuit interrupter operating mechanism settles into the closed position, vibrations tend to overcome some of the friction in the system, and result in a high allegedly "healthy" load between the latch and the D-shaft. Elastic energy storage during closing can also help to "load up" the trip latch in the closed position, resulting in the appearance of a seemingly high, healthy latch load, that does not reflect the full negative effect of friction throughout the system upon opening. It has been seen that operating mechanisms with friction issues can have healthy latch load, and still fail to open. An operating mechanism with friction issues can tend to stall during opening due to high friction after only a very slight movement of the trip latch upon opening the latch. The load on the trip latch relaxes as it moves slightly from behind the released latch, and the operating mechanism stalls. There is usually slight movement of the trip latch (such that the D-shaft often cannot be reset) from the releasing of elastically stored energy before the operating mechanism stalls. It thus is seen from experience that latch load is only a weak and variable function of opening reliability, and is insufficiently accurate to properly evaluate mechanical reliability. Therefore, an alternate measure and method of measurement for assessing the circuit interrupter mechanism reliability was found in the "trip margin".

The new measure of "trip margin" was developed to ensure that the operating mechanism operates reliably. Trip margin measures the force on the trip latch during its movement after opening of the latch. The trip margin is a non-static or changing measurement over time. When plotted, a trip margin curve often starts from an initial load, followed by a drop in force. This drop in force is evidence of variation that was not evident from the initial load, i.e., the "latch load." The curve eventually trends upward due to increasing mechanical advantage in the kinematics of the mechanism design. Thus, the characteristic trip margin curve has been found to have a "check mark"' shape, that is, dropping and then climbing eventually much higher.

The extent of the force loss varies from circuit interrupter to circuit interrupter and is not completely understood. Circuit interrupters with a low trip margin are prone to stalling and those whose contact force goes to zero will almost certainly fail to trip. On many occasions, circuit interrupters with acceptable initial load values were seen to stall. That is, the trip margin curve goes "negative" and, when the force reaches zero, the operating mechanism stalls. This has been seen to correlate strongly to no-trip issues in service. It has also been seen in examination of poorly performing interrupters that the shape of the trip margin curve contains information about the amount, location and nature of the frictional issues in the operating mechanism. That is, the shape of the trip margin curve correlates to the location of the friction in the operating mechanism.

It is observed that the low point on the trip margin curve almost always happens early during the process of opening and the overall forces and distances in the region of interest are low enough to make the measurement practical. The measurement apparatus must be very rigidly located relative to the interrupter mechanism and capable of precise distance and force measurement. This has been achieved using a trip margin test measurement apparatus.

In view of this information, there is room for improvement in the method of determining if a circuit interrupter operating mechanism has acceptable trip margin. First, as noted above, the present method of determining the trip margin requires the circuit interrupter to be disposed on a test bed. This is a problem as removing a circuit interrupter from service is time and labor intensive and requires a replacement circuit interrupter while the original circuit interrupter is being tested. There is, therefore, a need for improvement.

SUMMARY OF THE INVENTION

These needs, and others, are met by at least one embodiment of the disclosed and claimed concept which provides a method of determining if a circuit interrupter operating mechanism has an acceptable trip margin, the method including determining a model trip margin, providing a circuit interrupter, the circuit interrupter disposed in situ, the circuit interrupter including an operating mechanism, determining a circuit interrupter trip margin by: providing an internal sensor assembly, the internal trip margin sensor assembly structured to record trip margin data, providing a computer structured to execute a transfer function module providing a transfer function module, executing the transfer function module on the computer, utilizing the trip margin sensor assembly to generate trip margin data, transmitting the trip margin data to the transfer function module, processing the trip margin data to generate a trip margin, determining if the trip margin is acceptable relative to the model trip margin. If the trip margin is acceptable, then continuing to 1) utilize the trip margin sensor assembly to generate trip margin data, 2) transmit the trip margin data to the transfer function module, 3) process the trip margin data to generate a trip margin, and 4) determine if the trip margin is acceptable relative to the model trip margin. Alternatively, if the trip margin is not acceptable, performing circuit interrupter remediation.

Another aspect of the disclosed and claimed concept is to provide an improved circuit interrupter, the general nature of which can be stated as including a housing having an interior region, a set of separable contacts enclosed within the interior region, an operating mechanism enclosed within the interior region and structured to switch the set of separable contacts between a CLOSED condition and an OPEN condition, and a trip margin test apparatus that can be generally stated as including a trip margin sensor assembly that is enclosed within the interior region, the trip margin test apparatus being structured to perform a trip margin test on the operating mechanism using the trip margin sensor assembly to detect a trip margin of the operating mechanism.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
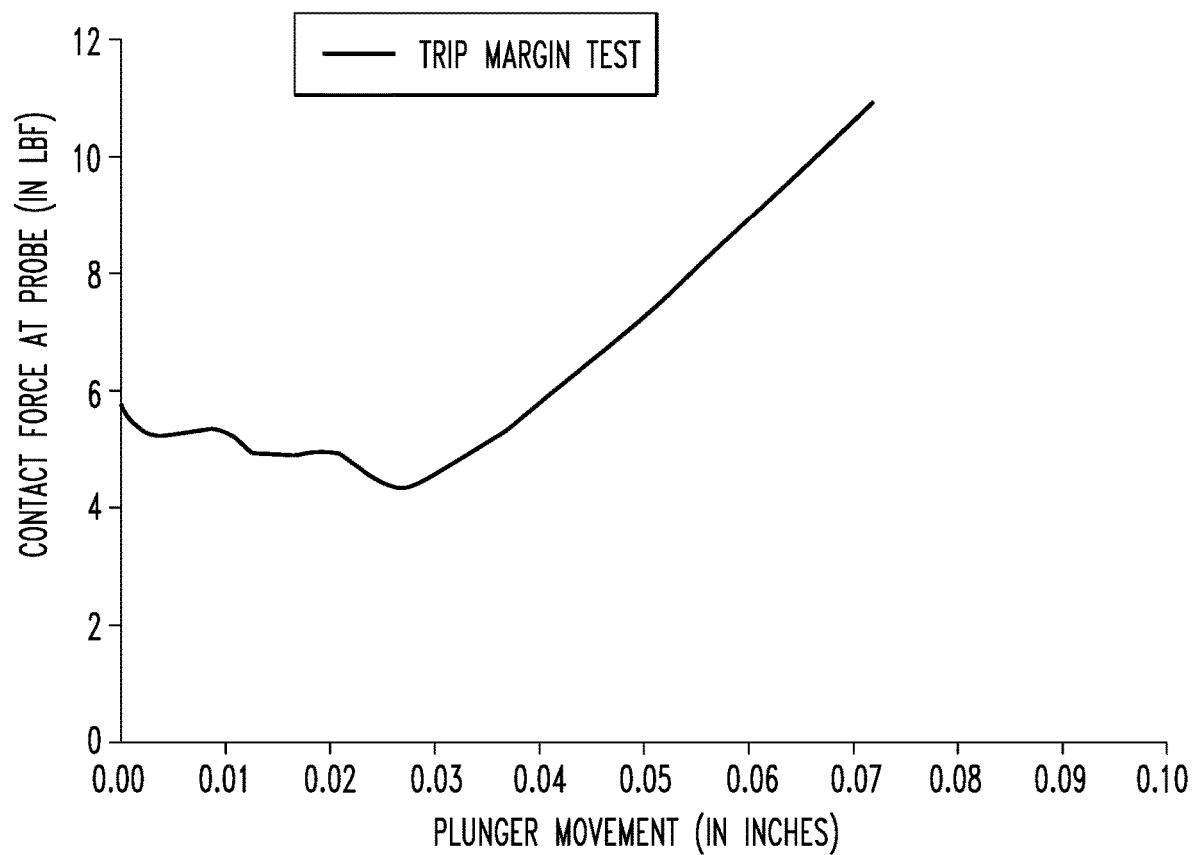
FIG. 1 is a graph showing an exemplary trip margin.
Figure 2:
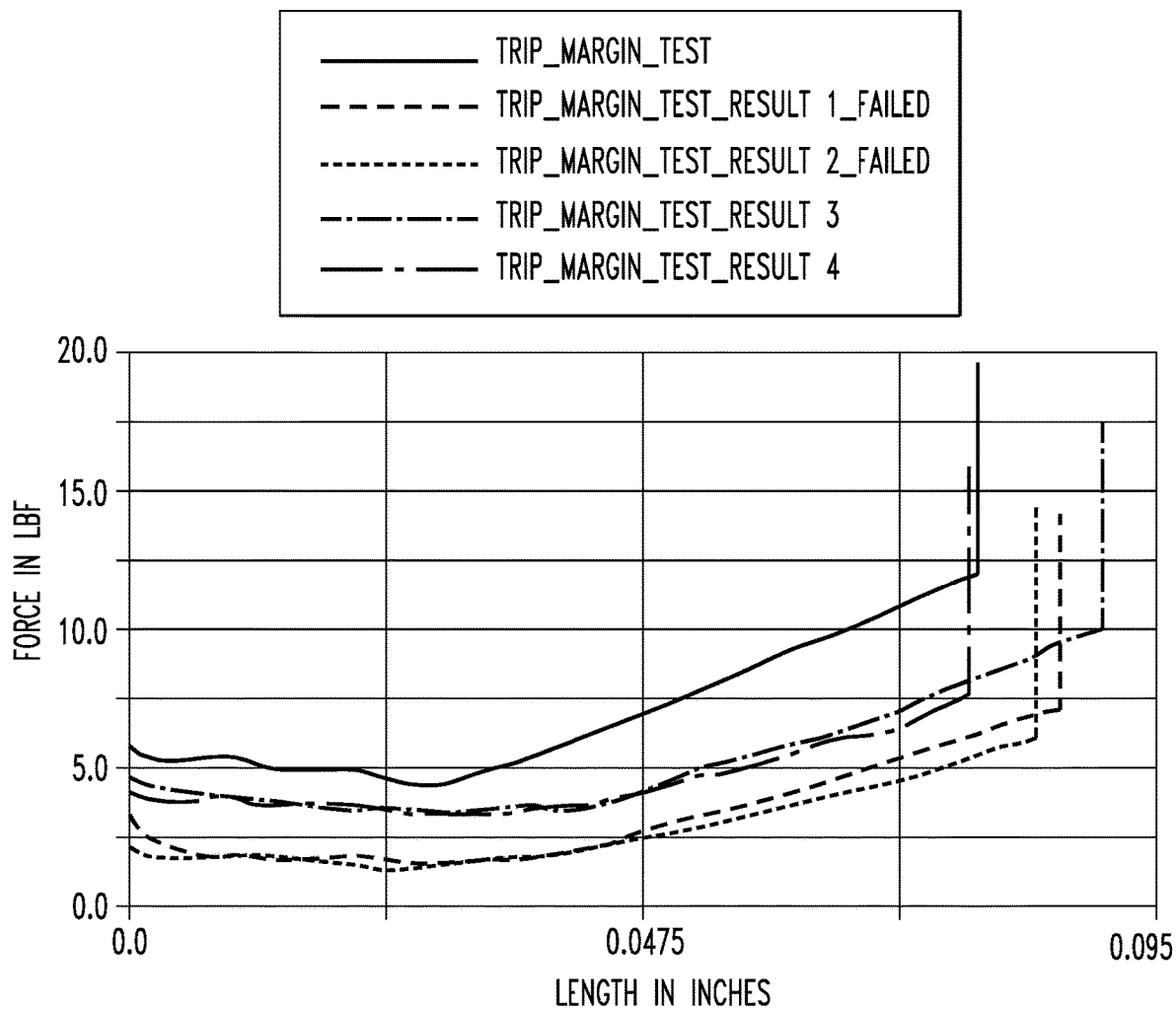
FIG. 2 is a graph showing multiple exemplary trip margins.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies. As such, as used herein, "structured to [verb]" recites structure and not function. Further, as used herein, "structured to [verb]" means that the identified element or assembly is intended to, and is designed to, perform the identified verb. Thus, an element that is merely capable of performing the identified verb but which is not intended to, and is not designed to, perform the identified verb is not "structured to [verb]."

As used herein, in a term such as, but not limited to, "[X] structured to [verb] [Y]," the "[Y]" is not a recited element. Rather, "[Y]" further defines the structure of "[X]." That is, assume in the following two examples "[X]" is "a mounting" and the [verb] is "support." In a first example, the full term is "a mounting structured to support a flying bird." That is, in this example, "[Y]" is "a flying bird." It is known that flying birds, as opposed to swimming/walking birds, typically grasp a branch for support. Thus, for a mounting, i.e., "[X]," to be "structured" to support bird, the mounting is shaped and sized to be something a bird is able to grasp similar to a branch. This does not mean, however, that the bird is being recited. In a second example, "[Y]" is a house; that is the second exemplary term is "a mounting structured to support a house." In this example, the mounting is structured as a foundation as it is well known that houses are supported by foundations. As before, a house is not being recited, but rather defines the shape, size, and configuration of the mounting, i.e., the shape, size, and configuration of "[X]" in the term "[X] structured to [verb] [Y]."

As used herein, "associated" means that the elements are part of the same assembly and/or operate together, or, act upon/with each other in some manner. For example, an automobile has four tires and four hubcaps. While all the elements are coupled as part of the automobile, it is understood that each hubcap is "associated" with a specific tire.

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component include a nut (as well as an opening through which the bolt extends) or threaded bore.

As used herein, a "coupling" or "coupling component(s)" is one or more component(s) of a "coupling assembly," i.e., either a "cooperative coupling" or a "unilateral coupling." That is, a cooperative coupling assembly includes at least two components that are structured to be coupled together. It is understood that the components of a cooperative coupling assembly are compatible with each other. For example, in a cooperative coupling assembly, if one coupling component is a snap socket, the other cooperative coupling component is a snap plug, or, if one cooperative coupling component is a bolt, then the other cooperative coupling component is a nut (as well as an opening through which the bolt extends) or threaded bore. In a "unilateral coupling," the "coupling" or "coupling component" is the construct that is structured to be coupled to another construct. For example, given a rope with a loop formed thereon, the loop in the rope is the "coupling" or "coupling component."

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof. Further, an object resting on another object held in place only by gravity is not "coupled" to the lower object unless the upper object is otherwise maintained substantially in place. That is, for example, a book on a table is not coupled thereto, but a book glued to a table is coupled thereto.

As used herein, the phrase "removably coupled" or "temporarily coupled" means that one component is coupled with another component in an essentially temporary manner. That is, the two components are coupled in such a way that the joining or separation of the components is easy and would not damage the components. For example, two components secured to each other with a limited number of readily accessible fasteners, i.e., fasteners that are not difficult to access, are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true. With regard to electronic devices, a first electronic device is "operatively coupled" to a second electronic device when the first electronic device is structured to, and does, send a signal or current to the second electronic device causing the second electronic device to actuate or otherwise become powered or active.

As used herein, "temporarily disposed" means that a first element(s) or assembly(ies) is resting on a second element(s) or assembly(ies) in a manner that allows the first element/assembly to be moved without having to decouple or otherwise manipulate the first element. For example, a book simply resting on a table, i.e., the book is not glued or fastened to the table, is "temporarily disposed" on the table.

As used herein, the statement that two or more parts or components "engage" one another means that the elements exert a force or bias against one another either directly or through one or more intermediate elements or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "temporarily coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate. Further, with electronic components, "operatively engage" means that one component controls another component by a control signal or current.

As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are to fit "snugly" together. In that situation, the difference between the size of the components is even smaller whereby the amount of friction increases. If the element defining the opening and/or the component inserted into the opening are made from a deformable or compressible material, the opening may even be slightly smaller than the component being inserted into the opening. With regard to surfaces, shapes, and lines, two, or more, "corresponding" surfaces, shapes, or lines have generally the same size, shape, and contours. With regard to elements/assemblies that are movable or configurable, "corresponding" means that when elements/assemblies are related and that as one element/assembly is moved/reconfigured, then the other element/assembly is also moved/reconfigured in a predetermined manner. For example, a lever including a central fulcrum and elongated board, i.e., a "see-saw" or "teeter-totter," the board has a first end and a second end. When the board first end is in a raised position, the board second end is in a lowered position. When the board first end is moved to a lowered position, the board second end moves to a "corresponding" raised position. Alternately, a cam shaft in an engine has a first lobe operatively coupled to a first piston. When the first lobe moves to its upward position, the first piston moves to a "corresponding" upper position, and, when the first lobe moves to a lower position, the first piston, moves to a "corresponding" lower position.

As used herein, a "path of travel" or "path," when used in association with an element that moves, includes the space an element moves through when in motion. As such, any element that moves inherently has a "path of travel" or "path." Further, a "path of travel" or "path" relates to a motion of one identifiable construct as a whole relative to another object. For example, assuming a perfectly smooth road, a rotating wheel (an identifiable construct) on an automobile generally does not move relative to the body (another object) of the automobile. That is, the wheel, as a whole, does not change its position relative to, for example, the adjacent fender. Thus, a rotating wheel does not have a "path of travel" or "path" relative to the body of the automobile. Conversely, the air inlet valve on that wheel (an identifiable construct) does have a "path of travel" or "path" relative to the body of the automobile. That is, while the wheel rotates and is in motion, the air inlet valve, as a whole, moves relative to the body of the automobile.

As used herein, a "planar body" or "planar member" is a generally thin element including opposed, wide, generally parallel surfaces, i.e., the planar surfaces of the planar member, as well as a thinner edge surface extending between the wide parallel surfaces. That is, as used herein, it is inherent that a "planar" element has two opposed planar surfaces with an edge surface extending therebetween. The perimeter, and therefore the edge surface, may include generally straight portions, e.g., as on a rectangular planar member such as on a credit card, or be curved, as on a disk such as on a coin, or have any other shape.

As used herein, the word "unitary" means a component that is created as a single piece or unit. That is, a component that includes pieces that are created separately and then coupled together as a unit is not a "unitary" component or body.

As used herein, "unified" means that all the elements of an assembly are disposed in a single location and/or within a single housing, frame or similar construct.

As used herein, a "radial side/surface" for a circular or cylindrical body is a side/surface that extends about, or encircles, the center thereof or a height line passing through the center thereof. As used herein, an "axial side/surface" for a circular or cylindrical body is a side that extends in a plane extending generally perpendicular to a height line passing through the center. That is, generally, for a cylindrical soup can, the "radial side/surface" is the generally circular sidewall and the "axial side(s)/surface(s)" are the top and bottom of the soup can. Further, as used herein, "radially extending" means extending in a radial direction or along a radial line. That is, for example, a "radially extending" line extends from the center of the circle or cylinder toward the radial side/surface. Further, as used herein, "axially extending" means extending in the axial direction or along an axial line. That is, for example, an "axially extending" line extends from the bottom of a cylinder toward the top of the cylinder and substantially parallel to, or along, a central longitudinal axis of the cylinder.

As used herein, a "tension member" is a construct that has a maximum length when exposed to tension, but is otherwise substantially flexible, such as, but not limited to, a chain or a cable.

As used herein, "generally curvilinear" includes elements having multiple curved portions, combinations of curved portions and planar portions, and a plurality of linear/planar portions or segments disposed at angles relative to each other thereby forming a curve.

As used herein, an "elongated" element inherently includes a longitudinal axis and/or longitudinal line extending in the direction of the elongation.

As used herein, "about" in a phrase such as "disposed about [an element, point or axis]" or "extend about [an element, point or axis]" or "[X] degrees about an [an element, point or axis]," means encircle, extend around, or measured around. When used in reference to a measurement or in a similar manner, "about" means "approximately," i.e., in an approximate range relevant to the measurement as would be understood by one of ordinary skill in the art.

As used herein, "generally" means "in a general manner" relevant to the term being modified as would be understood by one of ordinary skill in the art.

As used herein, "substantially" means "by a large amount or degree" relevant to the term being modified as would be understood by one of ordinary skill in the art.

As used herein, "at" means on and/or near relevant to the term being modified as would be understood by one of ordinary skill in the art.

As used herein, "in electronic communication" is used in reference to communicating a signal via an electromagnetic wave or signal. "In electronic communication" includes both hardline and wireless forms of communication; thus, for example, a "data transfer" or "communication method" via a component "in electronic communication" with another component means that data is transferred from one computer to another computer (or from one processing assembly to another processing assembly) by physical connections such as USB, Ethernet connections or remotely such as NFC, blue tooth, etc. and should not be limited to any specific device.

As used herein, "in electric communication" means that a current passes, or can pass, between the identified elements. Being "in electric communication" is further dependent upon an element's position or configuration. For example, in a circuit interrupter, a movable contact is "in electric communication" with the fixed contact when the contacts are in a closed position. The same movable contact is not "in electric communication" with the fixed contact when the contacts are in the open position.

As used herein, a "computer" is a device structured to process data having at least one input device such as, but not limited to, a keyboard, mouse, or touch-screen, at least one output device, e.g., a display, a graphics card, a communication device, e.g., an Ethernet card or wireless communication device, permanent memory, e.g., a hard drive, temporary memory, i.e., random access memory, and a processor, e.g., a programmable logic circuit. The "computer" may be a traditional desktop unit but also includes cellular telephones, tablet computers, laptop computers, as well as other devices, such as gaming devices that have been adapted to include components such as, but not limited to, those identified above. Further, the "computer" may include components that are physically in different locations. For example, a desktop unit may utilize a remote hard drive for storage. Such physically separate elements are, as used herein, a "computer." Further, a "computer" may include components that are temporarily coupled to other elements thereof. For example, a programmable logic circuit such as, but not limited to a processor or "CPU" and a memory device that are disposed in a circuit interrupter housing assembly and which are structured to be temporarily coupled to a display and an input device is a "computer." Conversely, a programmable logic circuit/memory device that is disposed in a circuit interrupter housing assembly and which is merely capable of being temporarily coupled to a display and an input device is not a "computer." That is, to be a "computer," such elements must be intended to be, and are designed to be, temporarily coupled to a display and an input device.

As used herein, the word "display" means a device structured to present a visible image. Further, as used herein, "present" means to create an image on a display which may be seen by a user.

As used herein, a "computer readable medium" includes, but is not limited to, hard drives, CDs, DVDs, magnetic tape, floppy drives, and random access memory.

As used herein, "permanent memory" means a computer readable storage medium and, more specifically, a computer readable storage medium structured to record information in a non-transitory manner. Thus, "permanent memory" is limited to non-transitory tangible media.

As used herein, "stored in the permanent memory" means that a module of executable code, or other data, has become functionally and structurally integrated into the storage medium.

As used herein, a "file" is an electronic storage construct for containing executable code that is processed, or, data that may be expressed as text, images, audio, video or any combination thereof.

As used herein, a "module" is an electronic construct used by a computer, or other processing assembly, and includes, but is not limited to, a computer file or a group of interacting computer files such as an executable code file and data storage files, used by a processor and stored on a computer readable medium. Modules may also include a number of other modules. It is understood that modules may be identified by their purpose of function. Unless noted otherwise, each "module" is stored in, i.e., incorporated into, permanent memory of at least one computer or processing assembly. As such, and as used herein, all modules define constructs and do not recite a function. All modules are shown schematically in the Figures.

As used herein, "structured to [verb]" when used in relation to a module, means that the module includes executable computer instructions, code, or similar elements that are designed and intended to achieve the purpose of the module. As noted above, all modules are incorporated into permanent memory and, as such, define constructs and do not recite a function.

Figure 3:
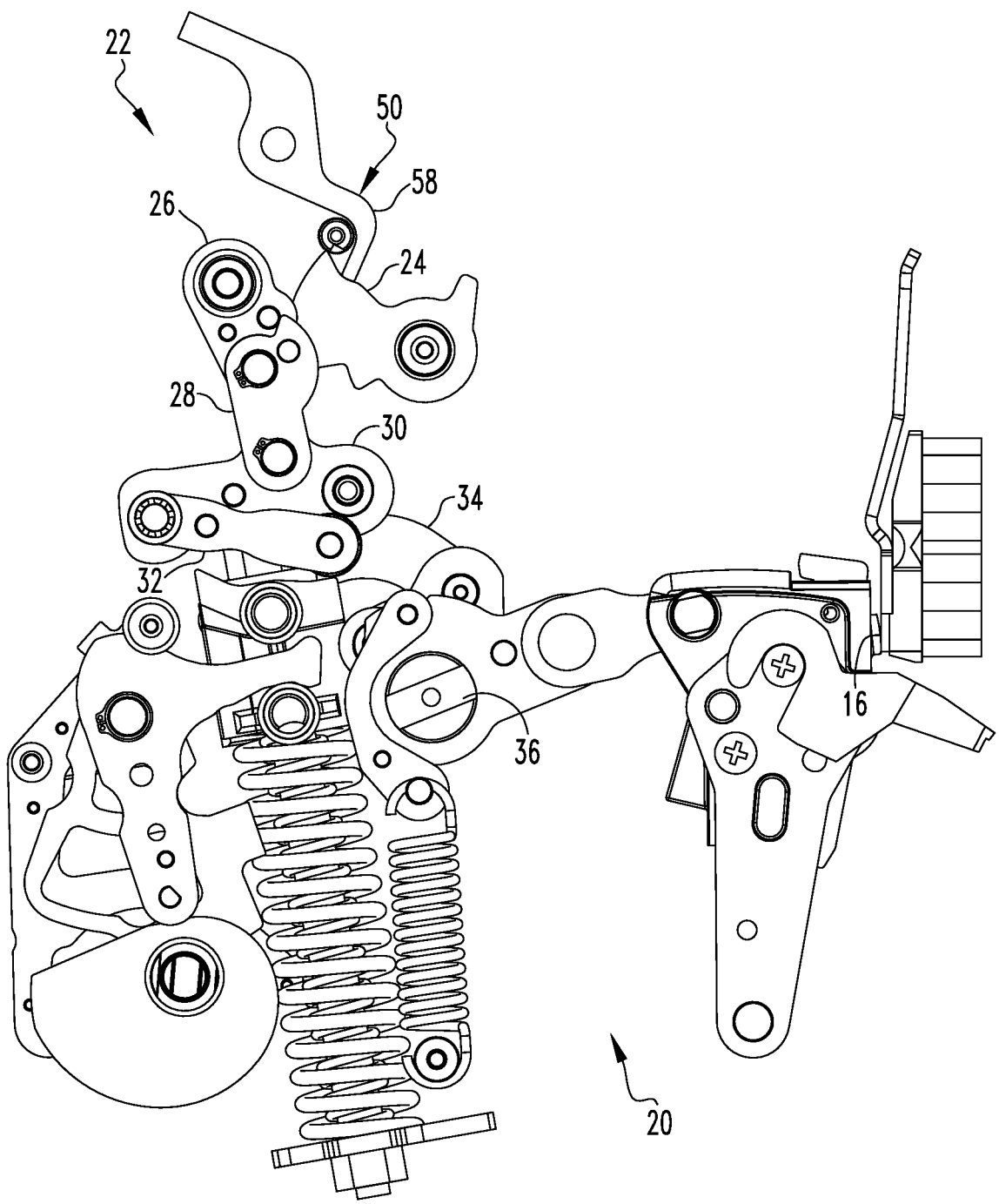
FIG. 3 is a side view of an operating mechanism of a circuit interrupter that is in accordance with the disclosed and claimed concept and that additionally depicts a portion of a trip margin test apparatus.

FIG. 3 shows an exemplary circuit interrupter 4 having a housing 8 and further having an operating mechanism 20. The housing 8 has an interior region 12, and the operating mechanism 20 is situated within the interior region 12. It is understood that a circuit interrupter includes other elements such as, but not limited to, a housing assembly, a conductor assembly including a number of sets of separable contacts 16, each set of separable contacts 16 including a movable contact and a stationary contact, and other elements, all of which are situated within the interior region 12. Selected elements of the circuit interrupter operating mechanism 20 include a linkage assembly 22 having a trip moving trip latch 24, a set of latch links 26 and 28, a cradle 30, an upper toggle link 32, a lower toggle link 34, other links, and a pole shaft 36. Again, all of these elements of the circuit interrupter 4 are situated within the interior region 12 of the housing 8.

The operating mechanism 20 further includes springs that are structured to, and do, impart a bias to selected elements of the linkage assembly 22. Further, as is known, the pole shaft 36 is operatively coupled to a number of movable contacts. As is known, the circuit interrupter includes a conductor assembly having a number of fixed, or stationary, contacts and the aforementioned movable contacts. The movable contacts are structured to, and do, move between an OPEN first position, wherein the movable contacts are not directly coupled to the fixed contacts and wherein the movable contacts are not in electrical communication with the fixed contacts, and, a CLOSED second position, wherein the movable contacts are directly coupled to the fixed contacts and wherein the movable contacts are in electrical communication with the fixed contacts. It is understood that the operating mechanism 20 is structured to, and does, move the movable contacts between the first and second positions. All of these elements of the circuit interrupter 4 are situated within the interior region 12 of the housing 8.

Thus, the operating mechanism 20 is structured to, and does, move between two configurations, a first configuration and a second configuration, corresponding the OPEN and CLOSED positions of the sets of separable contacts. That is, when the operating mechanism 20 is in the first configuration, the movable contacts are in the first position, and, when the operating mechanism 20 is in the second configuration, the movable contacts are in the second position. Further, it is understood that each element of the operating mechanism 20 moves between a first position and a second position corresponding to the operating mechanism configuration. That is, for example, the trip moving trip latch 24 moves between a first position and a second position corresponding to the first and second positions of the operating mechanism as well as the first and second positions of the movable contacts.

The trip moving trip latch 24 is a catch that prevents the operating mechanism 20 from moving between configurations. That is, when the movable contacts are in the second position, the latch plate 26 is latched against the trip moving trip latch 24. In some embodiments, the latch plate 26 is latched against a D-shaft, as described above. The bias of the operating mechanism springs biases the operating mechanism 20 toward the first configuration. As noted above, however, latch plate 26 cooperating with the trip moving trip latch 24 prevents the operating mechanism 20 from moving between configurations. When an overcurrent condition occurs, a trip unit of the circuit interrupter 4 moves the trip moving trip latch 24 out of the path of the latch plate 26. When this occurs, the bias of the operating mechanism springs cause the operating mechanism 20 to move from the second configuration to the first which, in turn, moves the movable contacts from the closed, second position to the open, first position.

Figure 4:
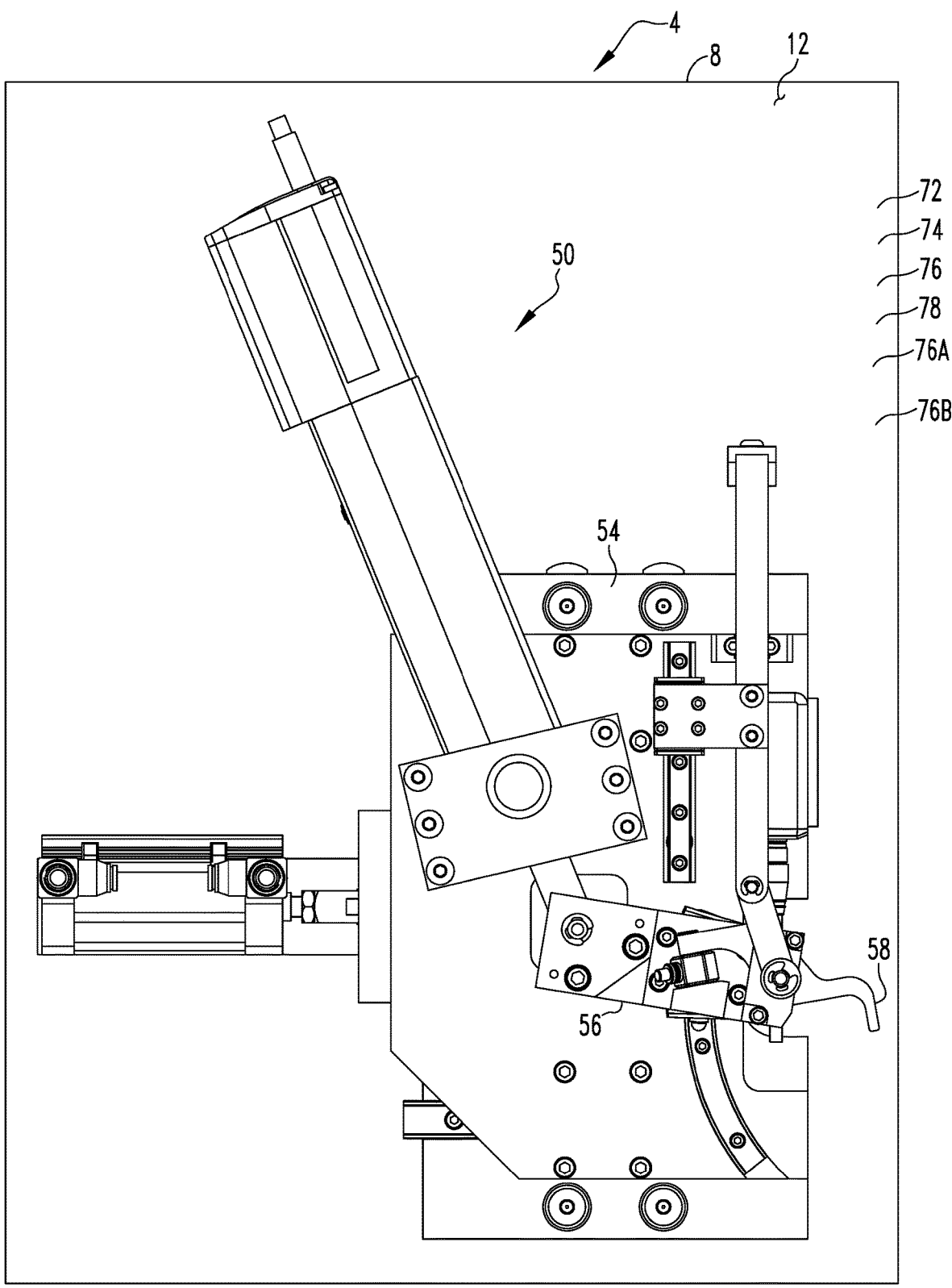
FIG. 4 is a side view of the circuit interrupter of FIG. 3 and the trip margin test apparatus thereof.
Figure 5:
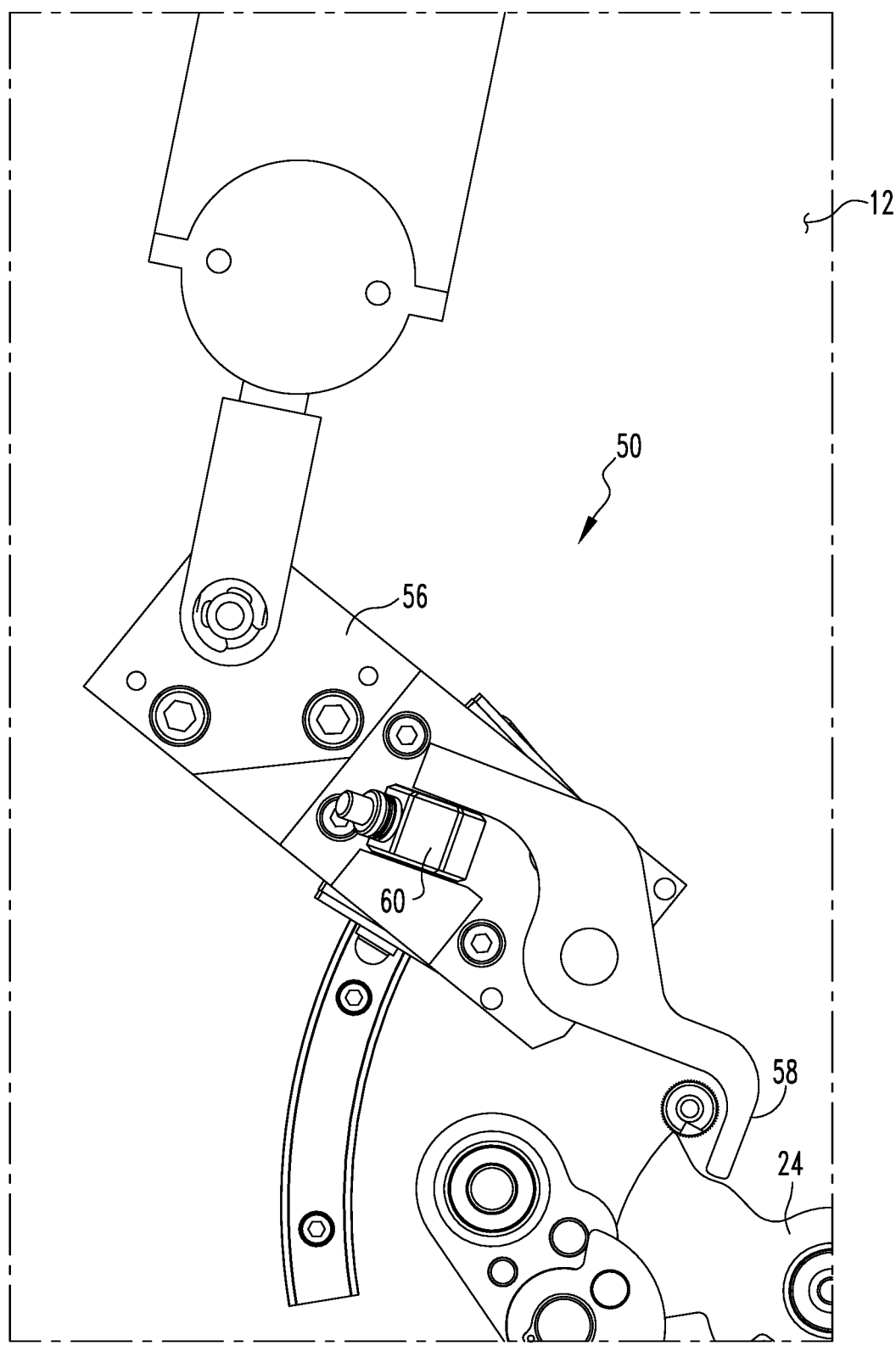
FIG. 5 is a schematic partial side view of the trip margin test apparatus of FIG. 4.
Figure 6:
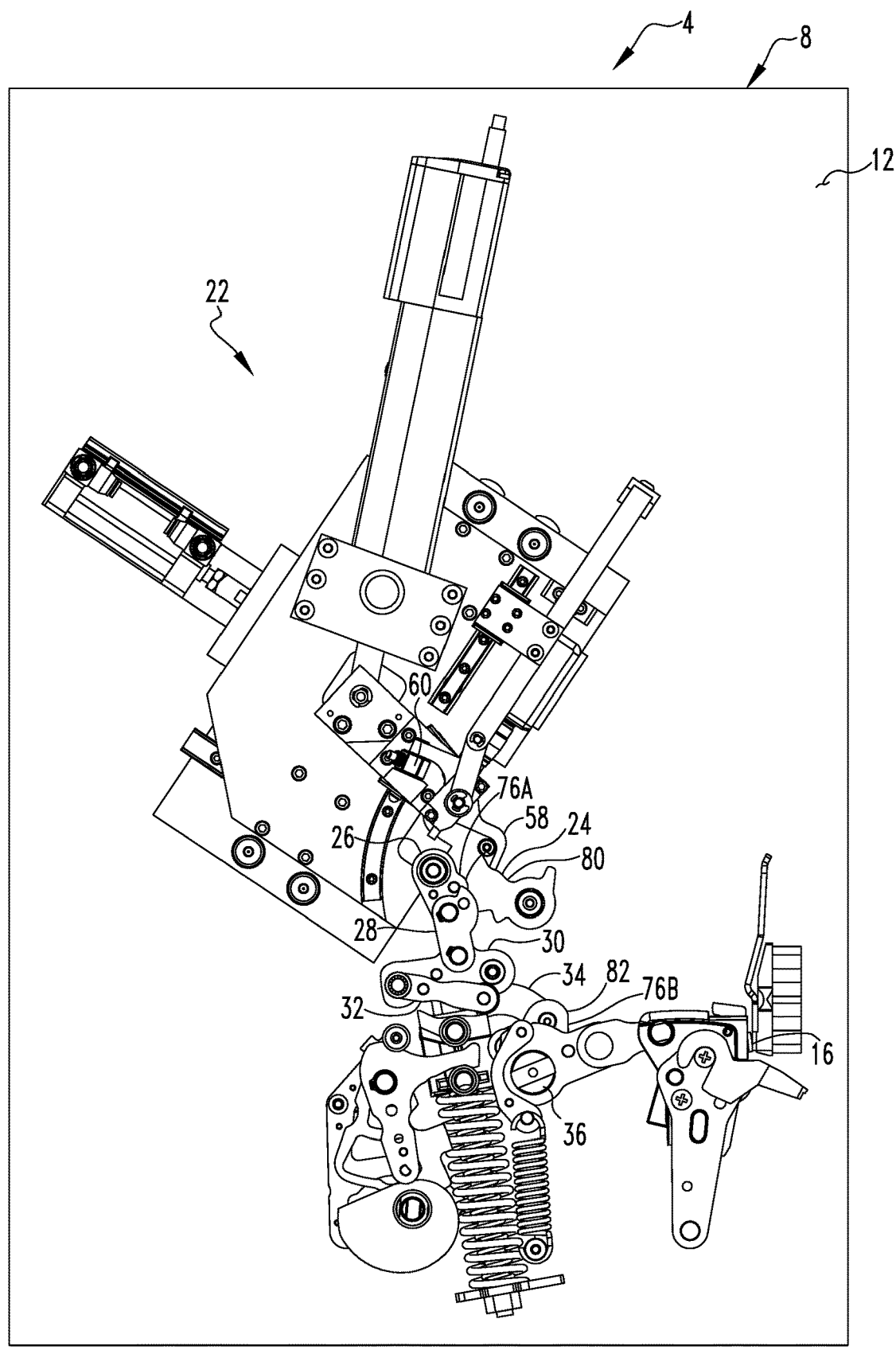
FIG. 6 is a schematic side view of the circuit interrupter of FIG. 3 and further showing the trip margin test apparatus engaging the operating mechanism of the circuit interrupter.

FIGS. 4-6 show a trip margin test apparatus 50. The trip margin test apparatus 50 is internal to the housing 8 and shares some similarities to an "external" trip margin test apparatus of a type that could be temporarily coupled to an operating mechanism of another circuit interrupter to measure the trip margin of the other circuit interrupter. That is, the "external" trip margin test apparatus would not be a part of the operating mechanism 20 or the circuit interrupter 4. It is understood that the external trip margin test apparatus, or portions thereof, would be inserted into the other circuit interrupter's housing assembly or otherwise disposed between elements of its operating mechanism. It is further understood that an "external" trip margin test apparatus cannot be used in situ. Such an "external" trip margin test apparatus is to be contrasted with the trip margin test apparatus 50 of the disclosed and claimed concept that is situated internal to the housing 8 of the circuit interrupter 4 and that advantageously permits the measurement of a trip margin when the circuit interrupter 4 is in situ.

The trip margin test apparatus 50 includes a drive assembly shown as servo-motor 54, a linkage assembly 56, a probe 58, and a trip margin sensor assembly 60. The trip margin test apparatus drive assembly, i.e., the servo-motor 54, is operatively coupled to the probe 58 via the trip margin test apparatus linkage assembly 56. Thus, the trip margin test apparatus drive assembly, i.e., the servo-motor 54, is structured to, and does, control the movement of the probe 58. The trip margin sensor assembly 60 is disposed on, or between, the trip margin test apparatus linkage assembly 56 and the probe 58 and is structured to determine, i.e., via direct measurement or otherwise, the force acting upon the probe 58. In an exemplary embodiment, the trip margin sensor assembly 60 is coupled, directly coupled, or fixed to the probe 58. In another exemplary embodiment, the trip margin sensor assembly 60 is coupled, directly coupled, or fixed to a drive shaft of the servo-motor 54.

The probe 58 is structured to, and does, move between a first position and a second position. To maintain the naming convention associated with the position of the movable contacts, as used herein, the initial position of the probe is the "second position." That is, during operation of the trip margin test apparatus 50, the operating mechanism 20 is initially in the second configuration and the probe 58 is disposed in contact with, and in the path of, the trip moving trip latch 24. As the trip moving trip latch 24 is initially latched against the latch plate 26, the trip moving trip latch 24 is not moving and there is no force acting on the probe 58. The trip margin test begins by moving the D-shaft so as to release the trip moving trip latch 24. But for the probe 58 being situated in contact with and being directly engaged with the trip hatched 24, the trip moving trip latch 24 would rapidly move to its first position while the operating mechanism 20 moves to the first configuration. The probe 58, however, resists the rapid motion of the trip moving trip latch 24. That is, the servo-motor 54 controls the motion of the probe 58, and therefore correspondingly controls the movement of the trip moving trip latch 24. The servo-motor 54 causes the probe 58 to move in a direction away from the trip moving trip latch 24 while being maintained in the path of the trip moving trip latch 24 and while remaining directly engaged with the trip moving trip latch 24. Because, the operating mechanism springs transmit a bias to the trip moving trip latch 24 via other elements in the linkage assembly 22, the trip moving trip latch 24 is biased against the probe 58 as the probe 58 moves. The bias force of the trip moving trip latch 24 against the probe 58 is measured by the trip margin test apparatus trip margin sensor assembly 60.

In an exemplary embodiment, the trip margin test lasts about one second during which time the trip moving trip latch 24 at the interface with the probe 58 moves a distance in the range of between about 0.01 inch and about 0.5 inch, or about 0.1 inch. Stated alternately, during the trip margin test the trip moving trip latch 24 moves a rotational distance in the range of between about three degrees and about five degrees, or about four degrees. It is noted that because such rotational distance is less than the full path of travel of the trip moving trip latch 24, the amount of data that is actually collected is only a subset of the full amount of data available. Further, as used herein, the data collected during the trip margin test for a specific circuit interrupter represents the "specific trip margin" for that circuit interrupter. In one embodiment of the method discussed below, the "specific trip margin" for a specific circuit interrupter can be used as the "model trip margin" (discussed below) for that specific circuit interrupter.

Generally, and in an exemplary embodiment, the data collected during multiple trip margin tests of multiple different circuit interrupters 4 of the same type can be used to determine a "model trip margin." As used herein, a "model trip margin" means a trip margin (which, as noted, is represented as a plot of force over time in the depicted exemplary embodiment) as well as "failure indicator" for a specific circuit interrupter or a type of a circuit interrupter. That is, each different specific circuit interrupter or each type of circuit interrupter has a "model trip margin." The "model trip margin" is further identified herein as the "specific model trip margin" if related to a specific circuit interrupter, or, "type model trip margin" if related to a type of circuit interrupter rather than a specific circuit interrupter. In an exemplary embodiment, the model trip margin is determined using a plurality of substantially new circuit interrupters of a selected type. That is, in this embodiment, the model trip margin for a type of circuit interrupter is based on collective data.

A "failure indicator" means a predetermined characteristic which indicates that the operating mechanism 20 is in danger of failing to move from the second configuration to the first configuration. In one exemplary embodiment, the "failure indicator" is expressed as a limit or threshold which is, hereinafter and as used herein, identified as a value for the "model trip margin limit." In an exemplary embodiment, the "failure indicator" is defined as a situation wherein the "model trip margin limit" is 2.0 lbf. That is, if the trip margin ever passes below the limit of 2.0 lbf, then the trip margin has violated the "model trip margin limit" and the operating mechanism 20 is in danger of failing to move from the second configuration to the first configuration. That is, if the trip margin is ever below the model trip margin limit, this is an indication that the operating mechanism 20 is nearing failure and needs to be repaired or replaced. Generally, the "model trip margin limit" is used as a "failure indicator" for a type of circuit interrupter operating mechanism 20 as opposed to a specific circuit interrupter operating mechanism 20. As is well known in the art, the "failure indicator," and in this exemplary embodiment the "model trip margin limit," is determined based on experience with working with each type of circuit interrupter.

In another exemplary embodiment, the "failure indicator" is expressed as a range which is hereinafter, and as used herein, identified as a "model trip margin range." That is, the "model trip margin range" includes a "primary trip margin" which is expressed as a line representing force relative to time, and the "model trip margin range" is a range above and/or below the "primary trip margin." In one example, the "model trip margin range" is +/−10% of the "primary trip margin." Generally, the "model trip margin range" is used as a "failure indicator" in association with a "specific model trip margin" as defined above.

In an exemplary embodiment, and as noted hereinbefore, the circuit interrupter 4 includes the internal trip margin test apparatus 50. As used herein, an "internal" trip margin test apparatus 50 includes elements that are installed, or which are otherwise coupled to the circuit interrupter 4 in a non-temporary manner. Further, the elements of an "internal" trip margin test apparatus 50 are usable in situ. As used herein, "in situ" means in a location and configuration for use. Thus, the circuit interrupter 4 on a test bed is not "in situ" whereas the circuit interrupter 4 that is installed and is in actual use is disposed "in situ."

The internal trip margin test apparatus 50 includes a computer 72, a transfer function module 74, and an internal trip margin sensor assembly 76, all shown schematically in FIG. 4. In the term "internal trip margin sensor assembly" the term "internal" has the same meaning as defined above. The internal trip margin sensor assembly 76 includes a number of sensors 78 that are individually or collectively structured to generate trip margin data. As used herein, and with respect to the sensors 78, "generate" means measure and record. It is understood, however, that the recordation of the measured data may occur in another location such as, but not limited to, in the internal trip margin test apparatus computer 72. Further, "trip margin data" means data that is intended to, and which is useable to, calculate a trip margin, as discussed below. The internal trip margin sensor assembly 76 is further structured to, and does, communicate the trip margin data to the internal trip margin test apparatus computer 72. In an exemplary embodiment, the internal trip margin sensor assembly 76 includes as at least a portion of the number of sensors 78 one or more sensors 78 that are structured to generate at least one of force data, motion data, temperature data or vibration data. As used herein, and when used to generate trip margin data, a sensor 78 structured to generate "force data," "motion data," "temperature data," and/or "vibration data" is structured to generate the data over, i.e., relative to, time. That is, for example, a thermocouple that simply provides an output indicating temperature does not provide "temperature data," as defined herein, because the thermocouple does not record the temperature over time. It is understood, however, that a thermocouple that is in communication with another device such as, but not limited to, a computer, that is structured to record data relative to time or over the course of time is structured to, and does, generate "temperature data." That is, the computer in this example is associated with the thermocouple and, as such, the thermocouple is structured to generate the data over time.

Further, in an exemplary embodiment, the operating mechanism 20 includes primary trip margin components and secondary trip margin components. As used herein, "primary" trip margin components means components of the operating mechanism 20 that directly transmit force from the bias generating elements to the element for which the trip margin has been previously determined. Thus, in the example disclosed above, the bias generating elements are springs, and, the element for which the trip margin has been previously determined is the trip moving trip latch 24. It is understood that in other embodiments, the bias is generated by other elements such as, but not limited to, a motor. Similarly, it is understood that in other embodiments, "the element for which the trip margin has been previously determined" is an element other than the trip moving trip latch 24. Conversely, as used herein, "secondary" trip margin components of the operating mechanism 20 that do not directly transmit force from the bias generating elements to the element for which the trip margin has been previously determined.

In an embodiment with primary trip margin components and secondary trip margin components, the internal trip margin sensor assembly 76 includes a number of primary trip margin component sensors 76A and a number of secondary trip margin component sensors 76B. That is, the reference numbers "76A" and "76B" represent a sensor, or a group of sensors, associated with a type of operating mechanism components. Each primary trip margin component sensor 76A is structured to generate primary trip margin component trip margin data. That is, as used herein, "primary trip margin component trip margin data" means "trip margin data" associated with a "primary trip margin component". Similarly, each secondary trip margin component sensor 76B is structured to generate secondary trip margin component trip margin data. That is, as used herein, "secondary trip margin component trip margin data" means "trip margin data" associated with a "secondary trip margin component". It is understood that those of skill in the art are able to utilize trip margin data collected from either, or both, primary trip margin components and secondary trip margin components to calculate the trip margin for an element coupled to the primary trip margin components and secondary trip margin components.

In an exemplary embodiment, the trip moving trip latch 24 is a primary trip margin component 80 and the primary trip margin component sensors 76A include a trip moving trip latch sensor 78A disposed at the interface of the trip moving trip latch 24 and the latch plate 26, i.e., at the prime measurement location, as defined above. Such a sensor 78 is structured to, and does, record the force acting on the trip moving trip latch 24 in a manner substantially similar to the sensors of the trip margin test apparatus 50 discussed above. In such an embodiment, the internal trip margin test apparatus 50 does not rely upon the transfer function module 74 as no data needs to be adapted to determine the trip margin, as discussed below.

In other embodiments, however, design constraints limit the locations at which sensors 78 are able to be disposed. Thus, the internal trip margin sensor assembly 76 includes the secondary trip margin component sensors 76B that are disposed, or otherwise associated with, a secondary trip margin component 82. When the trip margin data includes data collected from locations other than the prime measurement location, e.g., from the secondary trip margin component sensors 76B, the data must be adapted so as to calculate the trip margin. This is accomplished by the transfer function module 74.

That is, as used herein, a "transfer function module" 74 means a module that is structured to, and does, convert, or adapt, data collected from locations other than the prime measurement location, into a trip margin. By way of a simplified example, assume a trip margin was determined for an operating mechanism having a "Y" shaped component with the prime measurement location at the bottom of the "Y." That is, the trip margin is a force at the prime measurement location (F@PML) Further, assume that when the operating mechanism is in situ, the prime measurement location is inaccessible and/or cannot have a sensor disposed thereat. Further, assume that two sensors (S1 and S2) are disposed at the upper tips of the "Y" shaped component. In such a configuration, the transfer function module 74 is structured to determine the trip margin by converting the measured forces at each upper tip of the "Y." That is, by using known equations from the field of statics and dynamics, a transfer function in the form an equation such as, F@PML=function (S1+S2) is developed. It is understood that those of skill in the art can generate such transfer functions/equations for any given configuration of components. Thus, the "transfer function module" 74 is a module that is structured to, and does, convert data collected from locations other than the prime measurement location, into a trip margin.

The transfer function module 74 is structured to be, and is, executed on the internal trip margin test apparatus computer 72. The transfer function module 74 is further structured to receive trip margin data from the internal trip margin sensor assembly 76. That is, the internal trip margin sensor assembly 76 is structured to be, and is, in electronic communication with the computer 72, and the computer 72 is structured to, and does, communicate the trip margin data to the transfer function module 74. In this regard, it is noted that the computer 72 potentially can be the same computer that is already resident on the circuit interrupter 4 and that provides data processing capability for the evaluation of fault conditions and other conditions and that also provides for the triggering of tripping operations and perform other such functions.

Because the elements of the internal trip margin test apparatus 50 are "internal," as defined above, the internal trip margin test apparatus 50 is usable in situ. That is, the circuit interrupter 4 advantageously does not have to be removed to a test bed, or similar construct, to determine the trip margin. Stated alternately, the circuit interrupter 4 is maintained in situ during the determination of the trip margin of the circuit interrupter 4. This solves the problem(s) noted above.

Accordingly, a method of determining if a circuit interrupter operating mechanism has acceptable trip margin includes: determining 1000 a model trip margin, providing 1002 a circuit interrupter, determining 1004 a trip margin of the circuit interrupter, and determining 1006 if the trip margin is acceptable relative to the model trip margin. That is, it is understood that, and as used herein, "determining if the trip margin is acceptable relative to the model trip margin" means comparing the trip margin to a standard, such as, but not limited to the trip margin limit and, if the trip margin is below the limit (and/or outside of an acceptable range), then the trip margin is not "acceptable." Further, it is understood that if the trip margin is acceptable, then as at 1008 continuing to 1) utilize the trip margin sensor assembly to generate further trip margin data, 2) transmit the further trip margin data to the transfer function module, 3) process the further trip margin data to generate a further trip margin, and 4) determine if the further trip margin is acceptable relative to the model trip margin. Alternatively, such as if the trip margin is not acceptable, initiating the performing 1010 of a circuit interrupter remediation. Further, as noted above, it is understood that the circuit interrupter 4 is disposed in situ and that the circuit interrupter 4 includes an operating mechanism. Thus, the method further includes maintaining 1012 the circuit interrupter 4 in situ for 1000 through 1008.

Determining 1004 a trip margin can be said to include: providing 1020 the internal trip margin sensor assembly 76 wherein the internal trip margin sensor assembly 76 is structured to, and does, generate trip margin data, providing 1022 the computer 72, which is structured to execute the transfer function module 74, providing 1024 the transfer function module 74, executing 1026 the transfer function module 74 on the computer 72, utilizing 1028 the trip margin sensor assembly 76 to generate trip margin data, transmitting 1030 the trip margin data to the transfer function module 74, processing 1032 the trip margin data in the transfer function module 74 to generate a trip margin.

In an exemplary embodiment, providing 1002 the circuit interrupter 4 includes providing 1050 the operating mechanism 20 to include a number of primary trip margin components and providing 1052 the operating mechanism 20 to include a number of secondary trip margin components. Further, determining 1004 a trip margin, and in an exemplary embodiment, providing 1020 the internal trip margin sensor assembly 76, includes providing 1060 the number of primary trip margin component sensors 76A, each of at least a subset of the primary trip margin component sensors 76A being structured to generate primary trip margin component trip margin data, and, providing 1062 the number of secondary trip margin component sensors 76B, each of at least a subset of the secondary trip margin component sensors 76B being structured to generate secondary trip margin component trip margin data. Further, and as noted above, the sensors 78 are structured to generate at least one of force data, motion data, temperature data, and vibration data. Thus, providing 1060 the number of primary trip margin component sensors 76A, and providing 1062 the number of secondary trip margin component sensors 76B includes providing 1064 the number of primary trip margin component sensors 76A that are structured to generate at least one of force data, motion data, and vibration data, and, providing 1066 the number of secondary trip margin component sensors 76B that are structured to generate at least one of force data, motion data, temperature data, and vibration data.

Further, determining 1004 a trip margin, and determining 1006 if the trip margin is acceptable relative to the model trip margin may include determining 1070 a model trip margin limit, and comparing 1072 the trip margin to the model trip margin limit. Alternatively, or additionally, determining 1004 a trip margin, and determining 1006 if the trip margin is acceptable relative to the model trip margin may include determining 1074 a model trip margin range, and comparing 1076 the trip margin to the model trip margin range.

Further, in an exemplary embodiment, the operating mechanism 20, i.e., the primary trip margin components 80 and secondary trip margin components 82, may include elements that are rotatably, or otherwise movably, coupled to each other. Any locations wherein elements are coupled to each other are, as used herein, an "interface." Further, just as the trip margin at a prime measurement location is calculated, a number of "interface margins" are calculated. As used herein, an "interface margin" means a measurement of force over the course of time wherein the force is a force acting on one of the elements defining the interface. Similarly, every component of the operating mechanism 20, i.e., the primary trip margin components 80 and secondary trip margin components 82, has an "element margin." As used herein, an "element margin" means a measurement of force over time of the force acting on that element. That is, for example, the pole shaft 36 has a "pole shaft element margin."

It is noted that as different elements/interfaces are disposed at different locations in the linkage of elements between the bias generating elements, e.g., springs, and the elements for which a trip margin is calculated, e.g., the trip moving trip latch 24, the shape of each element/interface margin is different compared to the trip margin. That is, for example, each element/interface margin reaches a low point at different times. This information is useful as comparing the trip margin to an interface margin will, in an exemplary embodiment, reveal when trip margin forces increase. This, in turn, is used to identify which elements of the operating mechanism 20 decrease the trip margin (including lowering/changing the trip margin to a level that is unacceptable).

Figure 7:
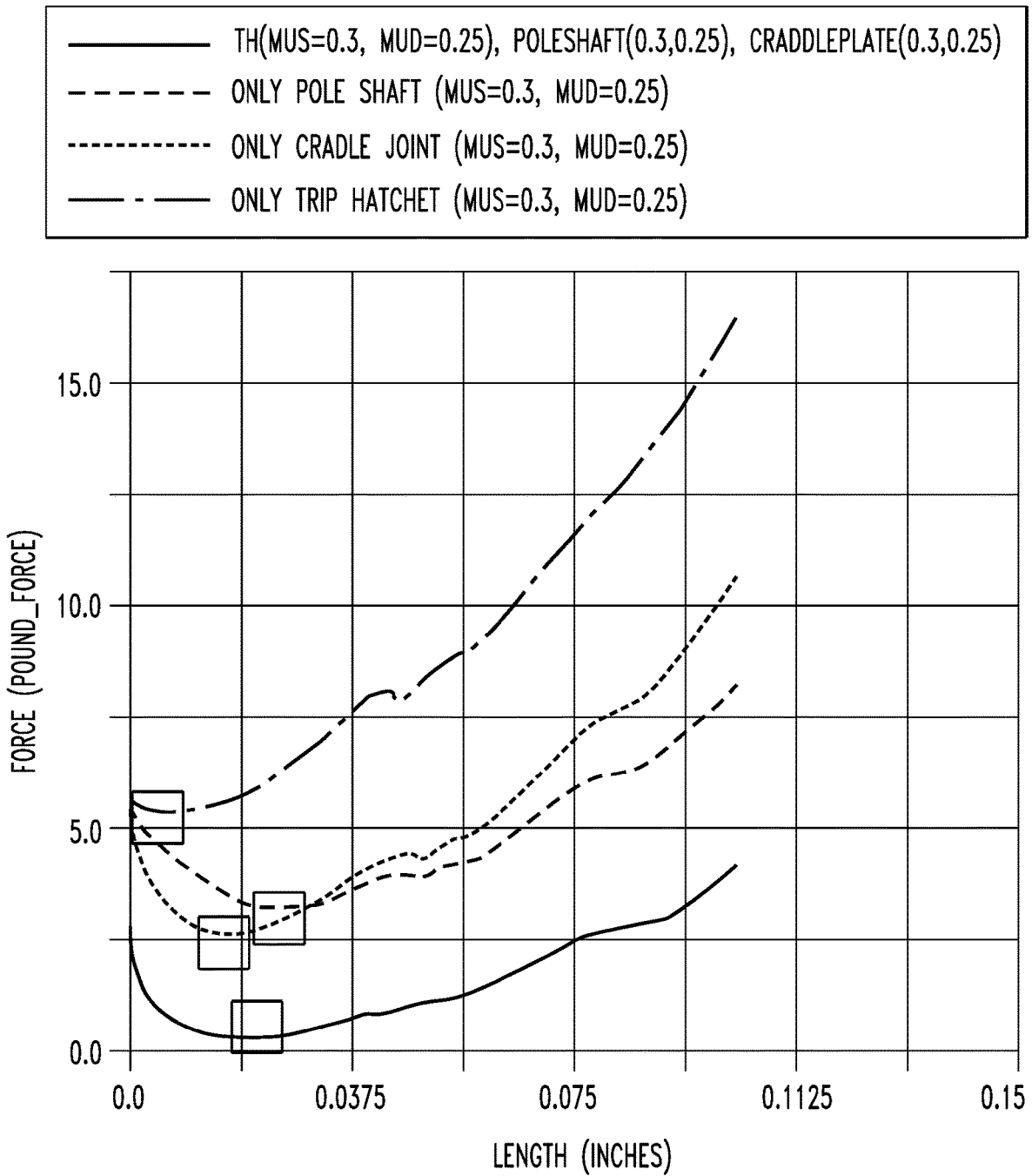
FIG. 7 is a graph showing a plurality of exemplary trip margins.
Figure 8A:
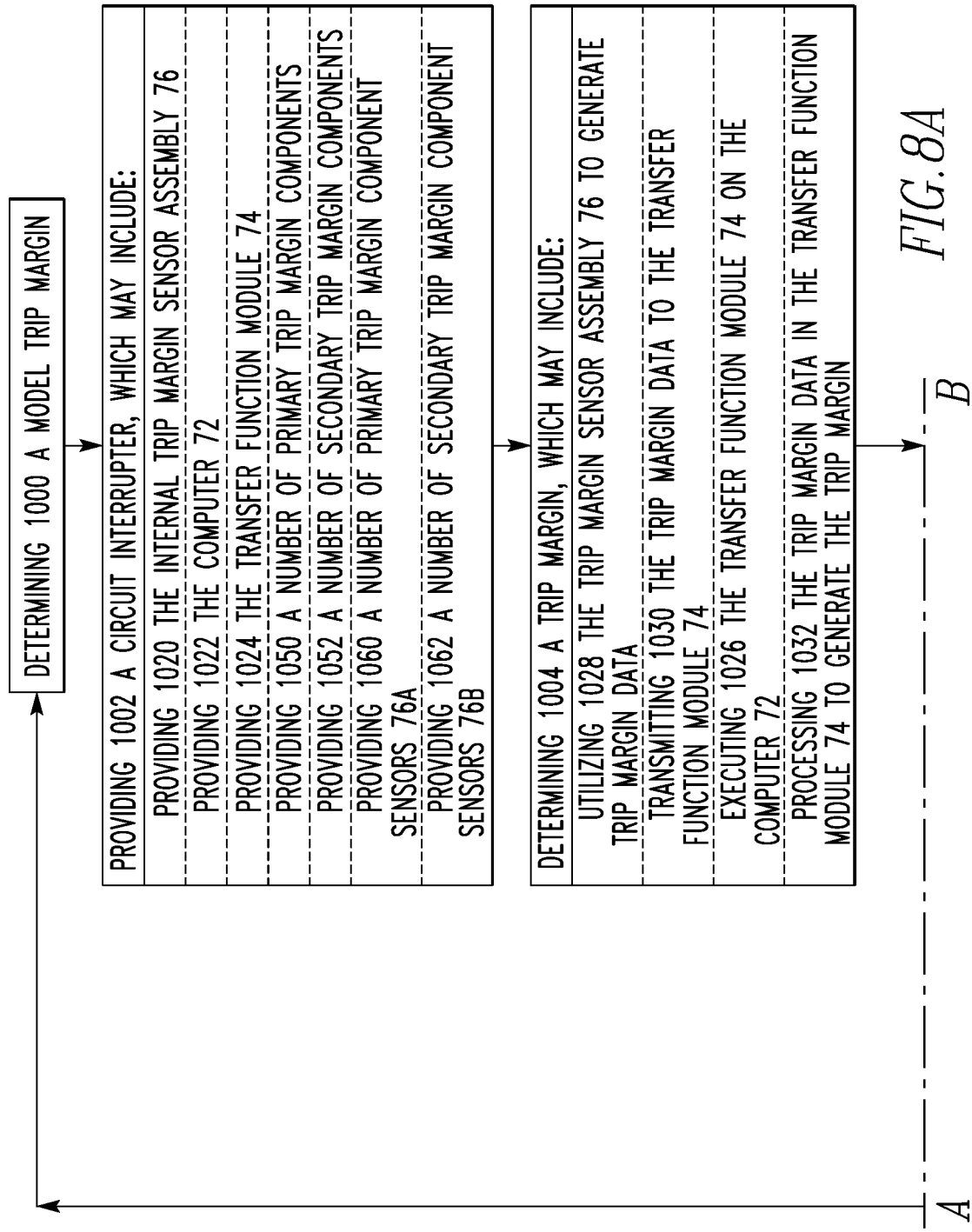
FIGS. 8A and 8B depict a flow diagram illustrating certain aspects of an improved method in accordance with the disclosed and claimed concept.
Figure 8B:
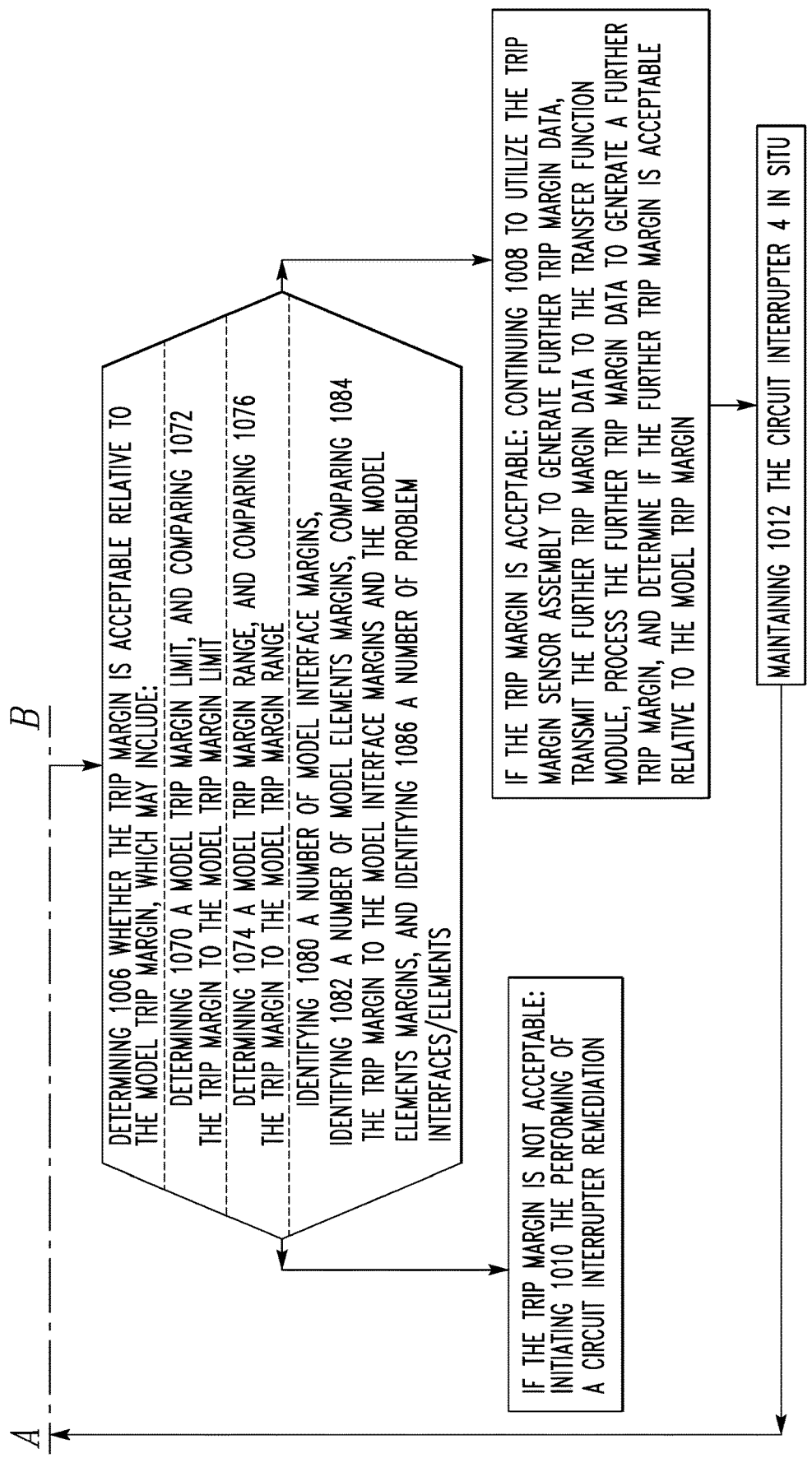

That is, FIG. 7 shows exemplary interface/element margin curves for a number of elements including the pole shaft 36. As shown, the interface margin for the cradle joint, i.e., the rotatable coupling between the latch link 28 and the cradle 30, is at a low at about 0.019 second. As shown in FIG. 1, the trip margin for a certain type of circuit interrupter is at a low at about 0.027 second. Thus, if a subsequent determination of the trip margin for a circuit interrupter of that type determines that the trip margin is unacceptable, e.g., the trip margin violates a model trip margin limit, and that the low now occurs at about 0.019 second, it can be viewed as an indication that the forces at the cradle joint have affected the trip margin. That is, the cradle joint can potentially be viewed as the cause of the trip margin being unacceptable.

Thus, determining 1000 a model trip margin and determining 1006 if the trip margin is acceptable may include: identifying 1080 a number of model interface margins, identifying 1082 a number of model elements margins, comparing 1084 the trip margin to the model interface margins and the elements margins, and identifying 1086 a number of problem interfaces/elements.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A method of determining if a circuit interrupter having an operating mechanism has acceptable trip margin, said method comprising:

determining a model trip margin;

providing a circuit interrupter, said circuit interrupter disposed in situ, said circuit interrupter comprising a housing and further comprising an operating mechanism enclosed within the housing;

determining a trip margin of the circuit interrupter by:

providing an internal trip margin sensor assembly enclosed within the housing, said internal trip margin sensor assembly structured to generate trip margin data;

providing a transfer function module;

providing a computer structured to execute the transfer function module;

executing said transfer function module on said computer;

transmitting said trip margin data to said transfer function module;

utilizing said trip margin sensor assembly to generate trip margin data;

processing said trip margin data to generate a trip margin;

determining if said trip margin is acceptable relative to said model trip margin;

if said trip margin is acceptable, continuing to 1) utilize said trip margin sensor assembly to generate further trip margin data, 2) transmit said further trip margin data to said transfer function module, 3) process said further trip margin data to generate a further trip margin, and 4) determine if said further trip margin is acceptable relative to said model trip margin; and if said trip margin is not acceptable, initiating a remediation on the circuit interrupter.

2. The method of claim 1 wherein the determining of the trip margin includes maintaining said circuit interrupter in situ.

3. The method of claim 1 wherein the providing of the circuit interrupter and the determining of the trip margin includes:
 providing with the operating mechanism a number of primary trip margin components; and
 providing a number of primary trip margin component sensors, each of at least a subset of said primary trip margin component sensors being structured to generate primary trip margin component trip margin data.

4. The method of claim 1 wherein the providing of the circuit interrupter and the determining of the trip margin includes:
 providing with the operating mechanism a number of secondary trip margin components; and
 providing a number of secondary trip margin component sensors, each of at least a subset of said secondary trip margin component sensors being structured to generate secondary trip margin component trip margin data.

5. The method of claim 1 wherein the providing of the circuit interrupter and the determining of the trip margin includes:
 providing with the operating mechanism a number of primary trip margin components;
 providing with the operating mechanism a number of secondary trip margin components;
 providing a number of primary trip margin component sensors, each of at least a subset of said primary trip margin component sensors being structured to generate primary trip margin component trip margin data; and
 providing a number of secondary trip margin component sensors, each of at least a subset of said secondary trip margin component sensors being structured to generate secondary trip margin component trip margin data.

6. The method of claim 5 wherein the providing of the number of primary trip margin component sensors and the providing of the number of secondary trip margin component sensors comprises:
 providing a number of primary trip margin component sensors structured to generate at least one of force data, motion data, and vibration data; and
 providing a number of secondary trip margin component sensors structured to generate at least one of force data, motion data, temperature data, and vibration data.

7. The method of claim 1 wherein the determining of the model trip margin and the determining if said trip margin is acceptable relative to said model trip margin comprise:
 determining a model trip margin limit; and
 comparing said trip margin to said model trip margin limit.

8. The method of claim 1 wherein the determining of the model trip margin and the determining if said trip margin is acceptable relative to said model trip margin comprise:
 determining a model trip margin range; and
 comparing said trip margin to said model trip margin range.

9. The method of claim 1 wherein the determining of the model trip margin and the determining if said trip margin is acceptable relative to said model trip margin include:
 identifying a number of model interface margins;
 identifying a number of model elements margins;
 comparing said trip margin to said model interface margins and the elements margins; and
 identifying a number of problem interfaces/elements.

10. A circuit interrupter comprising:
 a housing having an interior region;
 a set of separable contacts enclosed within the interior region;
 an operating mechanism enclosed within the interior region and structured to switch the set of separable contacts between a CLOSED condition and an OPEN condition; and
 a trip margin test apparatus comprising a trip margin sensor assembly that is enclosed within the interior region, the trip margin test apparatus being structured to perform a trip margin test on the operating mechanism using the trip margin sensor assembly to detect a trip margin of the operating mechanism; and
 wherein the trip margin test apparatus further comprises a computer, the computer being structured to make a comparison between the trip margin and a model trip margin and, responsive to the comparison, the computer being structured to make a determination whether or not the trip margin is acceptable relative to the model trip margin.

11. The circuit interrupter of claim 10 wherein the trip margin test apparatus comprises a probe, the probe being engaged with the operating mechanism.

12. The circuit interrupter of claim 11 wherein the trip margin test apparatus comprises a servo-motor that is cooperable with the probe and that is structured to move the probe with respect to the operating mechanism.

13. The circuit interrupter of claim 11 wherein the operating mechanism comprises a latch, the probe being engaged with the latch during at least a portion of the trip margin test.

14. The circuit interrupter of claim 10 wherein the trip margin test apparatus is structured to communicate the trip margin to a computer.

15. The circuit interrupter of claim 10 wherein, responsive to the determination being the trip margin is acceptable:
 utilizing the trip margin test apparatus to generate a further trip margin; and
 making another determination whether or not the further trip margin is acceptable relative to the model trip margin.

16. The circuit interrupter of claim 10 wherein, responsive to the determination being the trip margin is unacceptable, initiating a remediation on the circuit interrupter.

17. The circuit interrupter of claim 10 wherein the computer comprises a transfer function module, and wherein the trip margin sensor assembly is structured to generate trip margin data, the transfer function module being structured to receive the trip margin data as an input and to generate as an output the trip margin.

* * * * *